US009325306B1

(12) United States Patent
Li

(10) Patent No.: US 9,325,306 B1
(45) Date of Patent: Apr. 26, 2016

(54) HIGH VOLTAGE SWITCH

(71) Applicant: United Silicon Carbide, Inc., Monmouth Junction, NJ (US)

(72) Inventor: Xueqing Li, East Brunswick, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/790,051

(22) Filed: Jul. 2, 2015

Related U.S. Application Data

(62) Division of application No. 14/592,542, filed on Jan. 8, 2015, now Pat. No. 9,190,993.

(51) Int. Cl.
*H03K 17/16* (2006.01)
*H03K 17/60* (2006.01)

(52) U.S. Cl.
CPC .............. *H03K 17/16* (2013.01); *H03K 17/161* (2013.01); *H03K 17/60* (2013.01)

(58) Field of Classification Search
CPC ........................... H03K 17/102; H01L 27/088
USPC .......................................................... 327/382
See application file for complete search history.

(56) References Cited

U.S. PATENT DOCUMENTS

| 4,692,643 | A  | * | 9/1987  | Tokunaga    | H03K 17/102 327/436 |
| 6,822,842 | B2 | * | 11/2004 | Friedrichs  | H03K 17/102 327/309 |
| 6,888,396 | B2 | * | 5/2005  | Hajimiri    | H03F 1/22 327/427 |
| 7,148,736 | B1 | * | 12/2006 | Tihanyi     | H03K 17/08142 327/377 |
| 7,821,069 | B2 |   | 10/2010 | Shiraki et al. | |
| 8,760,214 | B2 | * | 6/2014  | Biela       | H03K 17/08142 327/430 |
| 8,866,253 | B2 | * | 10/2014 | Weis        | H03K 17/063 257/499 |
| 8,912,840 | B2 | * | 12/2014 | Aggeler     | H03K 17/102 327/430 |
| 9,035,690 | B2 | * | 5/2015  | Weis        | H03K 17/102 327/427 |
| 2011/0291738 | A1 | * | 12/2011 | Biela    | H03K 17/08142 327/430 |
| 2013/0193525 | A1 |   | 8/2013  | Weis et al. | |

OTHER PUBLICATIONS

Biela et al., "Balancing Circuit for a 5kV/50ns Pulsed Power Switch Based on SiC-JFET Super Cascade", Pulsed Power Conference, Jun. 28, 2009, Piscataway, New Jersey, 635-640.

* cited by examiner

*Primary Examiner* — Ryan Jager
(74) *Attorney, Agent, or Firm* — Baker & Hostetler LLP

(57) ABSTRACT

A high-voltage switching device is formed by: connecting a number of normally-on transistors, such as JFETs, in series with each other, where the drain of each transistor is connected to the source of the next; connecting the chain of normally-on transistors in series with a normally-off switch component, such as a MOSFET, where the drain of the normally-off switch component is connected to the source of the first transistor in the chain in the chain; and, for each transistor, connecting a voltage-clamping device, such as a diode, with the anode of the voltage-clamping device connected to the source of the transistor and the cathode of the voltage-clamping device connected to the gate of the next transistor in the chain.

5 Claims, 11 Drawing Sheets

HIGH VOLTAGE SWITCH

CROSS-REFERENCES TO RELATED APPLICATIONS

This application is a divisional of U.S. patent application Ser. No. 14/592,542 High Voltage Switch (Li) filed Jan. 8, 2015, the disclosure of which is incorporated herein by reference in its entirety.

BACKGROUND

The subject matter relates generally to semiconductor switches using multiple semiconductor devices, and particularly to high-voltage cascode switches that use multiple devices in series.

SUMMARY

A high-voltage switching device may be formed by: connecting a number of normally-on transistors, such as junction field-effect transistors (JFETs), in series with each other, where the drain of each transistor is connected to the source of the next; connecting the chain of normally-on transistors in series with a normally-off switch component such as a metal-oxide field-effect transistor (MOSFET), where the drain of the normally-off switch component is connected to the source of the first transistor in the chain; and for each transistor, connecting a voltage-clamping device, such as a diode, with the anode of the voltage-clamping device connected to the source of the transistor and the cathode of the voltage-clamping device connected to the gate of the next transistor in the chain. This arrangement helps to ensure that: the bias (or leakage) currents are distributed uniformly among the transistors and not dependent on transistors parameters; and that the total bias current, which is the additional leakage caused by biasing the circuits, is only twice the bias current of a single voltage-clamping diode and is not dependent on the number of series-connected transistors.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying drawings.

DETAILED DESCRIPTION OF ILLUSTRATIVE EMBODIMENTS

Figure 1:
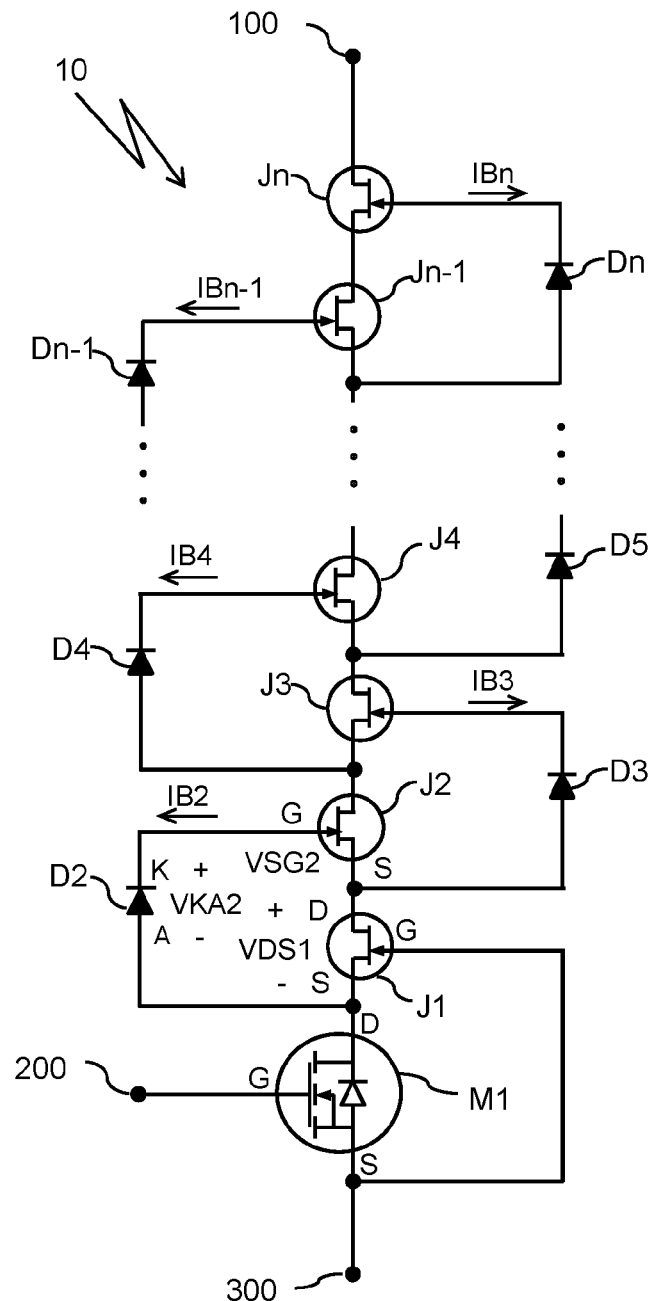
FIG. 1 is an electrical schematic of a circuit example switch including a chain of JFETs and a MOSFET along with plural voltage-clamping diodes.

A high-voltage switching device may be formed of many components by: connecting a number of normally-on transistors, such as JFETs, in series with each other and with a normally-off switch component such as a MOSFET, where the drain of each device is connected to the source of the next; and connecting a voltage-clamping device, such as a diode for each transistor, with the anode of the diode connected to the source of the transistor and the cathode of the diode connected to the gate of the next transistor in the chain. The switch component is placed in series before the first transistor in the chain.

This arrangement helps to ensure that: the bias (or leakage) currents are distributed uniformly among the transistors and not dependent on transistor parameters; and that the total bias current, which is the additional leakage caused by biasing the circuits, is only twice the bias current of a single voltage-clamping diode and is not dependent on the number of series-connected transistors.

The switch component may be either a high-voltage or low-voltage device. Where a low-voltage normally-off semiconductor switch component is used, it may be, for example, a MOSFET, JFET, static induction transistor (SIT), BJT, or insulated-gate bipolar transistor (IGBT). Low-voltage normally-off silicon MOSFETs, with typical voltage ratings from 15 volts to 50 volts, are suitable for use as switch components of the high-voltage switching devices described herein. The switch component may also be a high-voltage MOSFET, JFET, BJT, IGBT, or similar device.

The transistors may be normally—on JFET or MOSFETs, for example. SiC normally-on JFETs are reliable and commercially available at blocking voltage above 1000 volts. SiC JFETs with blocking voltages in the range of 1000 volts to 5000 volts are useful for creating high-voltage switching devices. In practice, the transistors and the switch component device may be n-channel or p-channel devices, although n-channel devices are more likely to be used. Load circuits, such as resistors, and dynamic balancing circuits, such as capacitors, can be added to improve performance.

A voltage-clamping device can be any device or circuit block that conducts a very small leakage current when the voltage is below the desired clamp voltage, and conducts a substantial current when the voltage reaches the desired clamp voltage. For example, avalanche diodes work well in this function, as do SiC MOSFETs that have a reliable and stable avalanche breakdown at the desired clamp voltage.

High-voltage switching devices of this kind may provide relatively low leakage current, high saturation current, high-voltage ratings, and low cost. These devices may be useful in such applications as high-voltage power conversion, such as applications requiring 3 kilovolts to 15 kilovolts power devices. Other uses include, for instance: high-voltage motor drives and traction systems; high-voltage pulse generators; high-voltage direct current (HVDC) transmission systems; flexible alternating current transmission systems (FACTS); ultra-high-voltage capacitor-charging; pulsed power; pulse generators; and test equipment, etc.

FIG. 1 is a schematic of an example high-voltage switch 10. The switch 10 includes a switching device, MOSFET M1, which may be a low-voltage normally-off device. Again, in practice this could any kind of switching component, such a MOSFET, JFET, BJT, or IGBT. The switch 10 also includes a plurality of transistors, JFETs J1-Jn, which may be high-voltage normally-on devices. Again, in practice the transistors could also be MOSFETs, for example. The transistors are connected in a chain in series drain to source.

The source of the first transistor in the chain J1 is connected to the drain of the switching device, MOSFET M1. The gate of the first transistor J1 is connected to the source of the switching device, MOSFET M1. Thus the JFET J1 and MOSFET M1 are connected in a cascode configuration. The MOSFET M1 and the chain of transistors J1 to Jn are connected in series to form a current path between the drain of the last transistor Jn at a terminal 100 and the source of the MOSFET M1 at a terminal 300. The gate of the MOSFET M1 is connected to a terminal 200.

For every transistor in the chain except the first transistor in the chain J1, there is a clamping device associated with the transistor, D2 to Dn, where an anode of the clamping device is connected to the source of the prior transistor in the chain and a cathode of the clamping device is connected to the gate of the transistor. Each transistor except the first transistor in the chain J1 has an associated bias current, IB2 to IBn, flowing from the gate of the associated transistor, J2 to Jn.

The high-voltage switch 10 is controlled via a gate terminal 200, which is coupled to the gate terminal of the MOSFET M1. When a high level voltage signal (typically from +5 volts to +15 volts) is applied to the gate terminal 200, the MOSFET M1 is turned on, and the JFET J1 is also turned on according to the method of operation of the cascode circuit. The turn-on of the JFET J1 brings down a voltage drop VDS1 between the drain and source terminals of the JFET J1 to a very small value, typically less than 2 volts, which, in turn, brings down a voltage drop VSG2 between the source and gate terminals of the JFET J2 to a very small value because the voltage drop VDS1 is equal to a sum of the voltage drop VSG2 and a voltage drop VKA2 between the cathode and anode terminals of the voltage clamping device D2. As a result, the gate-source voltage of the JFET J2, which is equal to −VSG2, is increased to a value above the threshold voltage of the JFET J2, which typically has a value of from −5 volts to −15 volts, thus, the JFET J2 is turned on. The turn-on of the JFET J2 causes the JFETs J3-Jn to turn on in the same manner.

When a low level voltage signal (typically from 0 volts to −5 volts) is applied to the gate terminal 200, the MOSFET M1 is turned off, and the JFET J1 is also turned off according to the method of operation of the cascode circuit. As the JFET J1 turns off, both the voltage drops VDS1 and VKA2 increase until the voltage drop VKA2 reaches the clamping voltage of the voltage clamping device D2 and is clamped to the clamping voltage of the voltage clamping device D2. Further increase of VDS1 does not increase the voltage drop VKA2 but increase the voltage drop VSG2 and decreases the gate-source voltage of the JFET J2, which is equal to −VSG2. When the gate-source voltage of the JFET J2 is decreased to a value below the threshold voltage of the JFET J2, the JFET J2 is turned off and starts to support further voltage increase between the drain terminal 100 and the source terminal 300.

After the JFET J2 is turned off, the voltage drop VDS1 is clamped to a value equal to a sum of the clamping voltage of the voltage clamping device D2 and a turn-off source-gate voltage of the JFET J2, which implies a dimensioning specification for selecting a voltage clamping device. The turn-off of the JFET J2 causes the JFETs J3-Jn to turn off in the same manner.

In the high-voltage switching device 10 in FIG. 1, the leakage currents for biasing the voltage clamping devices D2-Dn are provided by the drain-to-gate leakage currents of the JFETs J2-Jn, respectively. In this arrangement, the leakage current of each of the voltage clamping devices D2-Dn is determined only by the associated transistors J2 to Jn. Ideally, if each of transistors J2-Jn has the same drain-to-gate leakage current of IB (meaning IB2=IB3= . . . =IBn=IB), then the last transistor in the chain Jn will have to provide a leakage current of IBn+IBn−1=2×IB for biasing the voltage clamping devices Dn−1 and Dn, and the transistors J2-Jn−1 will each have to provide a leakage current of IB for biasing their associated voltage clamping devices. The first transistor in the chain J1 will have to sink the leakage current of IB3 for biasing the voltage clamping device D3. In the example of FIG. 1, the leakage currents of the JFETs J2-Jn may change with time and operation temperature. This in turn may affect the operation of the voltage clamping devices D2-Dn.

Figure 2:
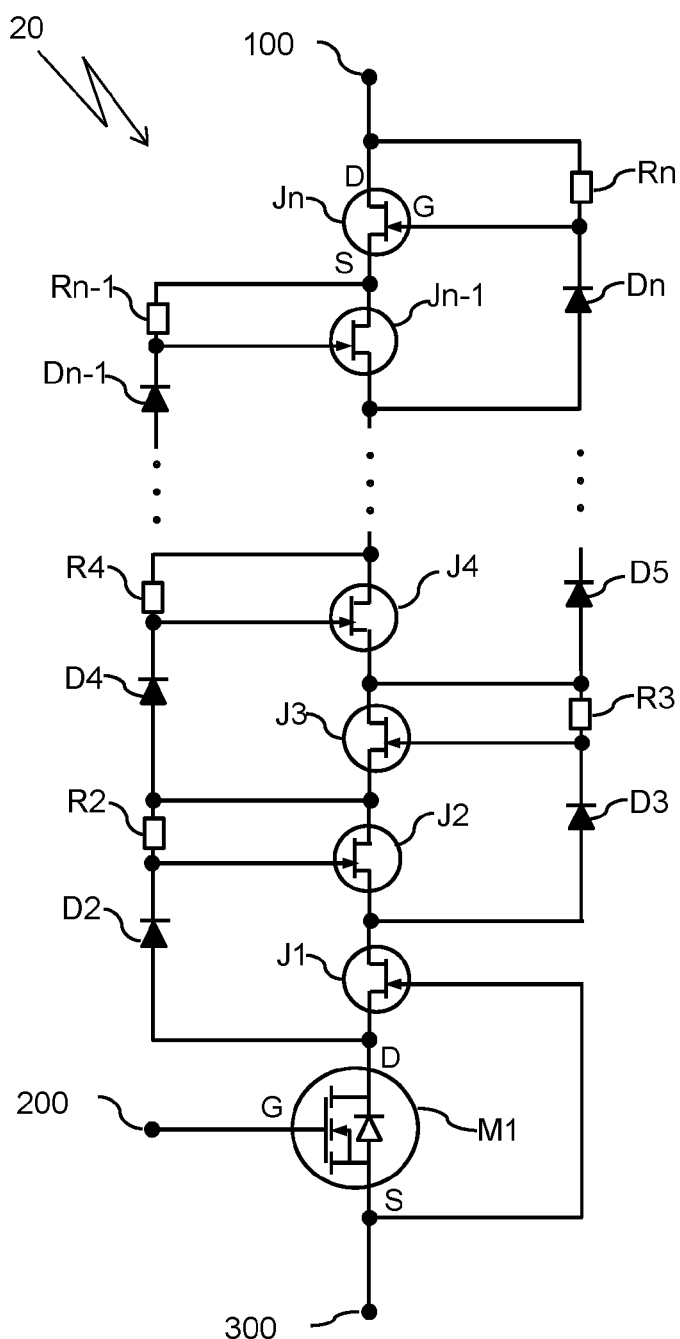
FIG. 2 shows the circuit of FIG. 1 with adding load circuits.

FIG. 2 illustrates a way to make the currents for biasing the clamping devices D2 to Dn independent of the leakage currents of the JFETs J2 to Jn. FIG. 2 depicts a high-voltage switch 20 made up of all the devices shown in FIG. 1 plus a plurality of load circuits R2 to Rn. Each load circuit R2 to Rn is connected between the drain and gate terminals of a corresponding JFETs J2-Jn. Each of the load circuits R2-Rn could be just a resistor with a predetermined value of resistance.

Figure 3:
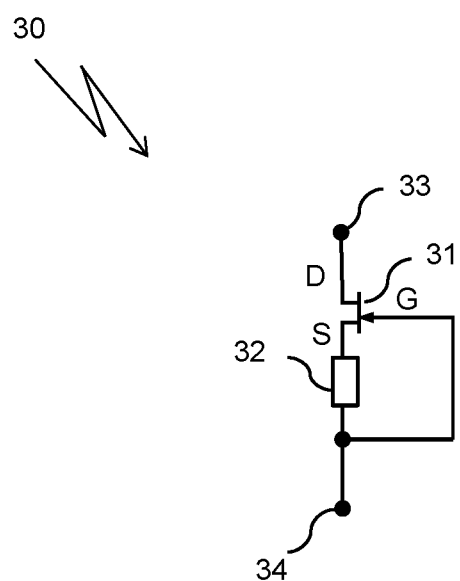
FIG. 3 shows an example load circuit.

Each of the load circuits R2-Rn could be a dynamic resistor having increased resistance with increased terminal voltage in order to provide a controlled leakage current at high terminal voltage and a low impedance at a low terminal voltage. FIG. 3 shows a non-limiting example of a dynamic resistor 30 including a normally-on transistor 31 having a drain terminal, a gate terminal, and a source terminal, and a feedback resistor 32. The drain and gate terminals of the normally-on transistor 31 are connected to a input terminal 33 and an output terminal 34 of the dynamic resistor in FIG. 3, respectively. The resistor 32 is connected between the source and gate terminals of the normally-on transistor 31 and is in the drain-to-source current path of the normally-on transistor 31.

Referring again to FIG. 2, with the arrangement of the load circuits R2-Rn as presented in FIG. 2, the load circuits R2-Rn will provide the required leakage currents during off-state for biasing the clamping devices D2-Dn, respectively. Therefore, the operations of the clamping devices D2-Dn will not be dependent on the leakage currents and parameters of the JFETs J1-Jn, meaning that a pre-selection of the JFETs J1-Jn is not required. If the clamping devices D2-Dn are biased with the same bias current IB, then the total additional leakage currents introduced for biasing the clamping devices D2-Dn is at most two times the bias current IB and is not dependent on the number of JFETs. Another advantage of the arrangement of the load circuits R2-Rn in FIG. 2 is that, during on-state, the load circuits R2-Rn pull up the potential on the gate terminal and forward-bias the gate-source p-n junction of each of the JFETs J2-Jn, which substantially increase the saturation currents of the JFETs J2-Jn and increase the pulse current handling capability of the high-voltage switching device 20 in FIG. 2.

In the high-voltage switching device 20 of FIG. 2, during turn-on transient, the JFETs J1-Jn may not turn on at the same time. The first JFET in the chain JFET J1 may turn on first and the last JFET in the chain Jn may turn on last. This could cause a reliability issue because the one that turns on last would have to support a full blocking voltage for a short period of time. To solve this problem, one or more dynamic balancing circuits C2-Cn could be used, as illustrated in FIG. 4, to synchronize a turn-on processes and a turn-off processes of the JFETs J1-Jn during switching transients.

Figure 4:
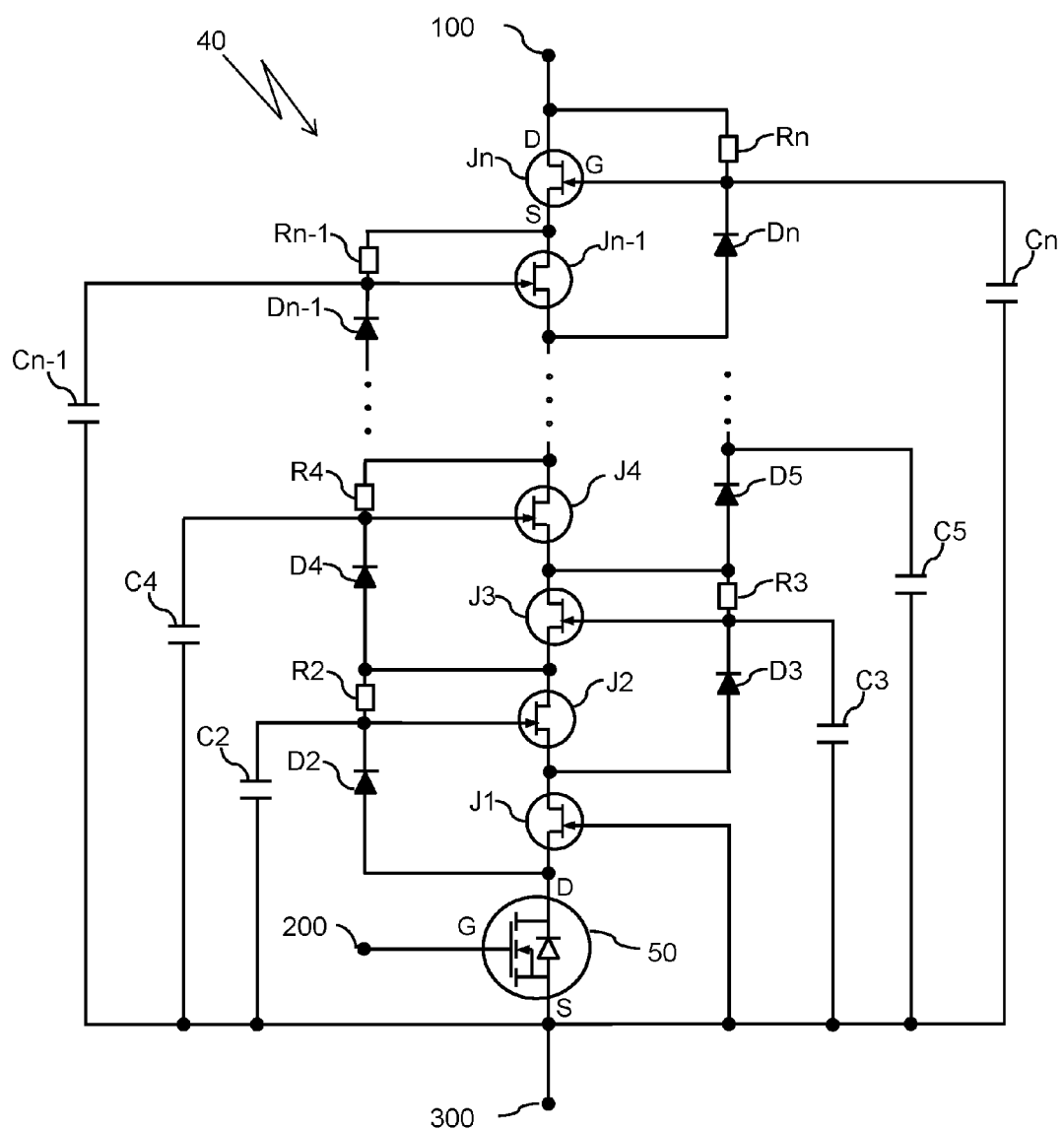
FIG. 4 shows the example circuit of FIG. 2 plus dynamic balancing circuits.

FIG. 4 shows a high-voltage switching device 40 which is similar to high-voltage switching device 20 of FIG. 2. The difference is that the switch 40 includes dynamic balancing circuits C2-Cn. Each of the dynamic balancing circuits C2-Cn is connected between the gate terminal of one of the JFETs J2-Jn and the source terminal of the MOSFET M1. Each of the dynamic balancing circuits C2-Cn tends to hold a potential on the gate terminal of the corresponding high-voltage normally-on JFET during the switching transients that helps to reduce the delay times and synchronize the turn-on process and the turn-off process of the JFETs J2-Jn. Each of the dynamic balancing circuits C2-Cn could be a capacitor or a capacitor and a resistor connected in series. The dynamic balancing circuits C2-Cn may cause an unbalanced voltage distribution of the JFETs J1-Jn if capacitances of the dynamic balancing circuits C2-Cn are too large. Therefore, the capacitances of the dynamic balancing circuits C2-Cn should be optimized to achieve both the synchronization of the turn-on process and the turn-off process and the balanced voltage distribution of the JFETs J1-Jn.

Figure 5:
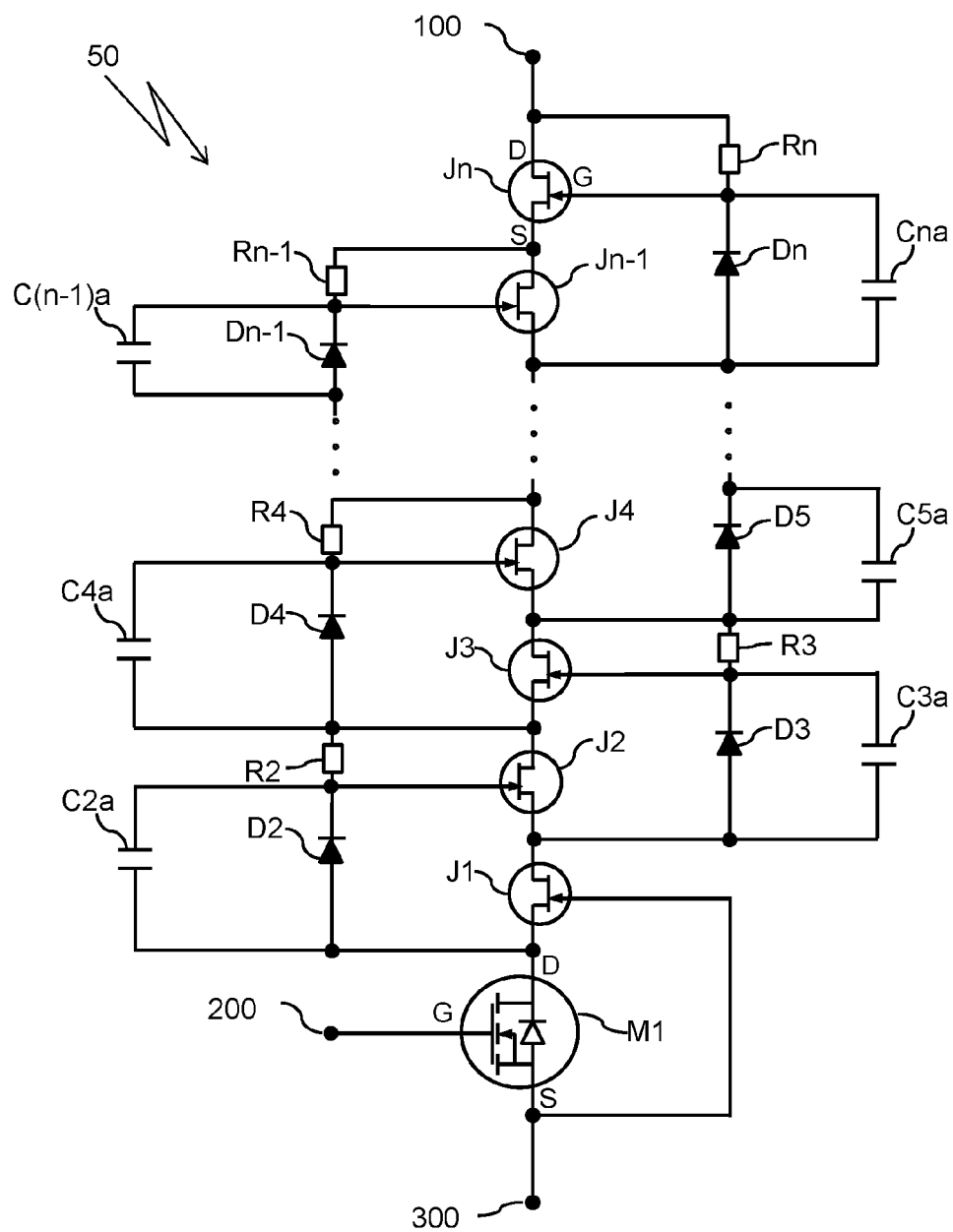
FIG. 5 shows the example circuit of FIG. 2 plus dynamic balancing circuits in an alternative configuration.

FIG. 5 shows a high-voltage switching device 50 which is a modification of the switch 40 of FIG. 4. In contrast to FIG. 4, in FIG. 5 each of the dynamic balancing circuits C2a-Cna is connected in parallel with one of the voltage clamping device D2-Dn. However, this does not change anything of the fundamental method of operation of the dynamic balancing circuits C2a-Cna. One advantage of the high-voltage switching device 50 in FIG. 5 is that each of the dynamic balancing circuits C2a-Cna supports a voltage in the off-state that is the same as the clamping voltage of the corresponding voltage clamping device. Thus, the dynamic balancing circuits C2a-Cna in the high-voltage switching device 50 in FIG. 5 requires a much lower voltage rating than the dynamic balancing circuits C2-Cn in the high-voltage switching device 40 in FIG. 4.

Figure 6:
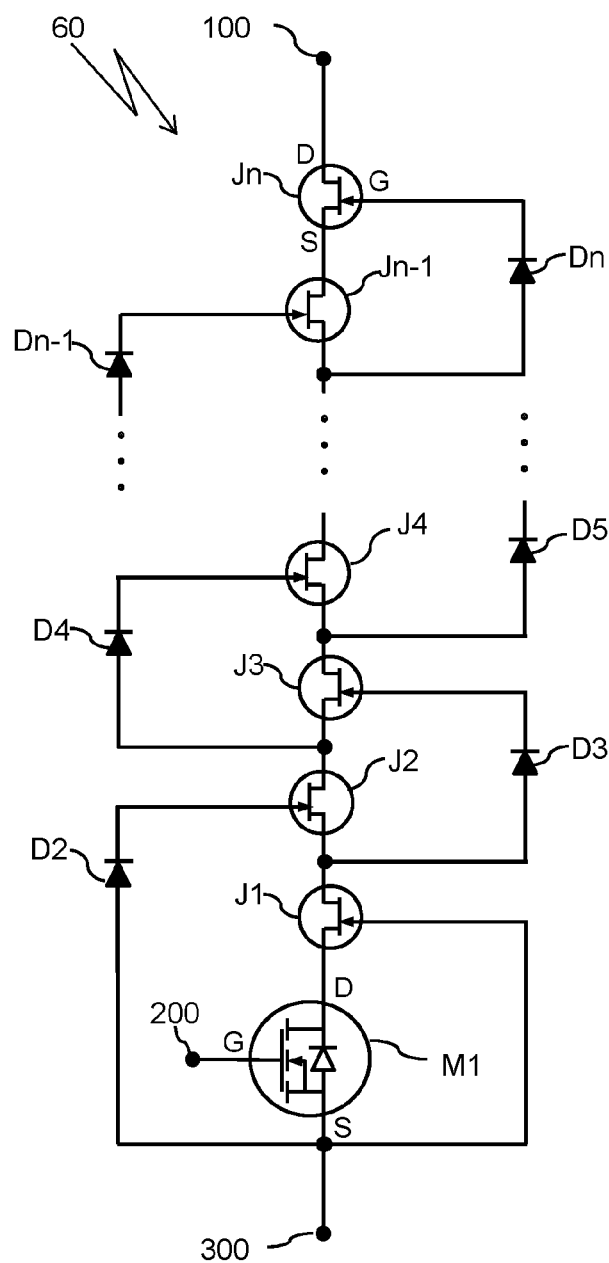
FIG. 6 is an electrical schematic of another circuit example switch including a chain of JFETs and a MOSFET along with plural voltage-clamping diodes.

FIG. 6 shows an example high-voltage switching device 60 which is substantially based on the switch 10 of FIG. 1. The difference is that the anode terminal of the voltage clamping device D2 is now connected to the source terminal of the MOSFET M1. This modification does not change anything of the fundamental method of operation of the voltage clamping device D2. The first JFET in the chain J1 and the MOSFET M1 form a cascode circuit having a normally-off operation mode and a blocking capability roughly the same as that of JFET J1. This cascode circuit can be replaced with a single high-voltage normally-off device, such as a high-voltage normally-off JFET, a high-voltage normally-off MOSFET, or a high-voltage normally-off IGBT, as illustrated in FIG. 7.

Figure 7:
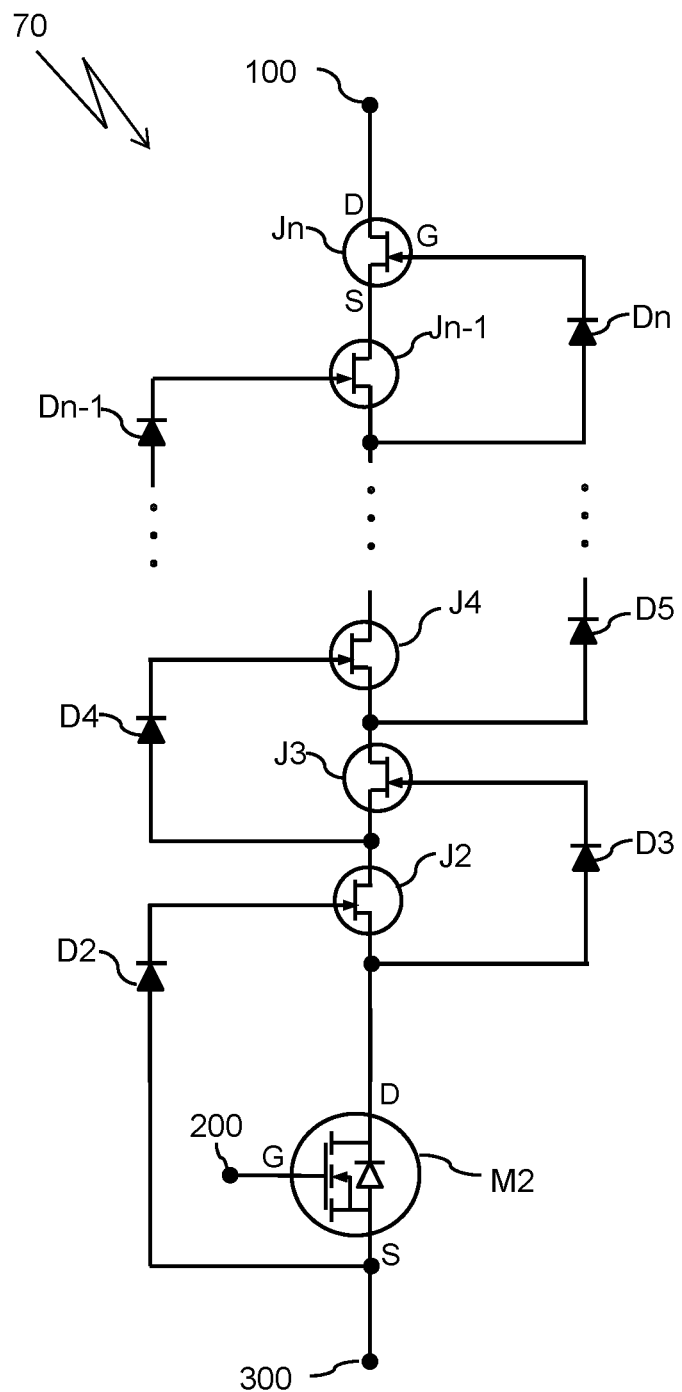
FIG. 7 is an electrical schematic of yet another circuit example switch including a chain of JFETs and a MOSFET along with plural voltage-clamping diodes.

FIG. 7 shows a high-voltage switching device 70 which is similar to the switch 60 of FIG. 6. The difference is that in FIG. 7 a high-voltage normally-off MOSFET M2 having a gate terminal, a drain terminal, and a source terminal is used to replace the cascode formed by the JFET J1 and MOSFET M1 of FIG. 6. Other types of high-voltage normally-off semiconductor devices can also be used in the place of M2 in the configuration shown in FIG. 7. For example, in addition to a MOSFET, a high-voltage normally-off JFET, MOSFET, BJT, or IGBT would also work. In the configuration illustrated in FIG. 7, the high-voltage normally-off device selected and the high-voltage normally-on transistor devices should ideally have approximately the same blocking capability.

The switch 70 operates similarly to the switch 60 of FIG. 6. Additional load circuits and dynamic balancing circuits can be added to the switch 70 to control the leakage currents of the voltage clamping devices D2-Dn and synchronize the turn-on and turn-off processes of the JFETs J2-Jn, as illustrated in FIG. 8 and FIG. 9.

Figure 8:
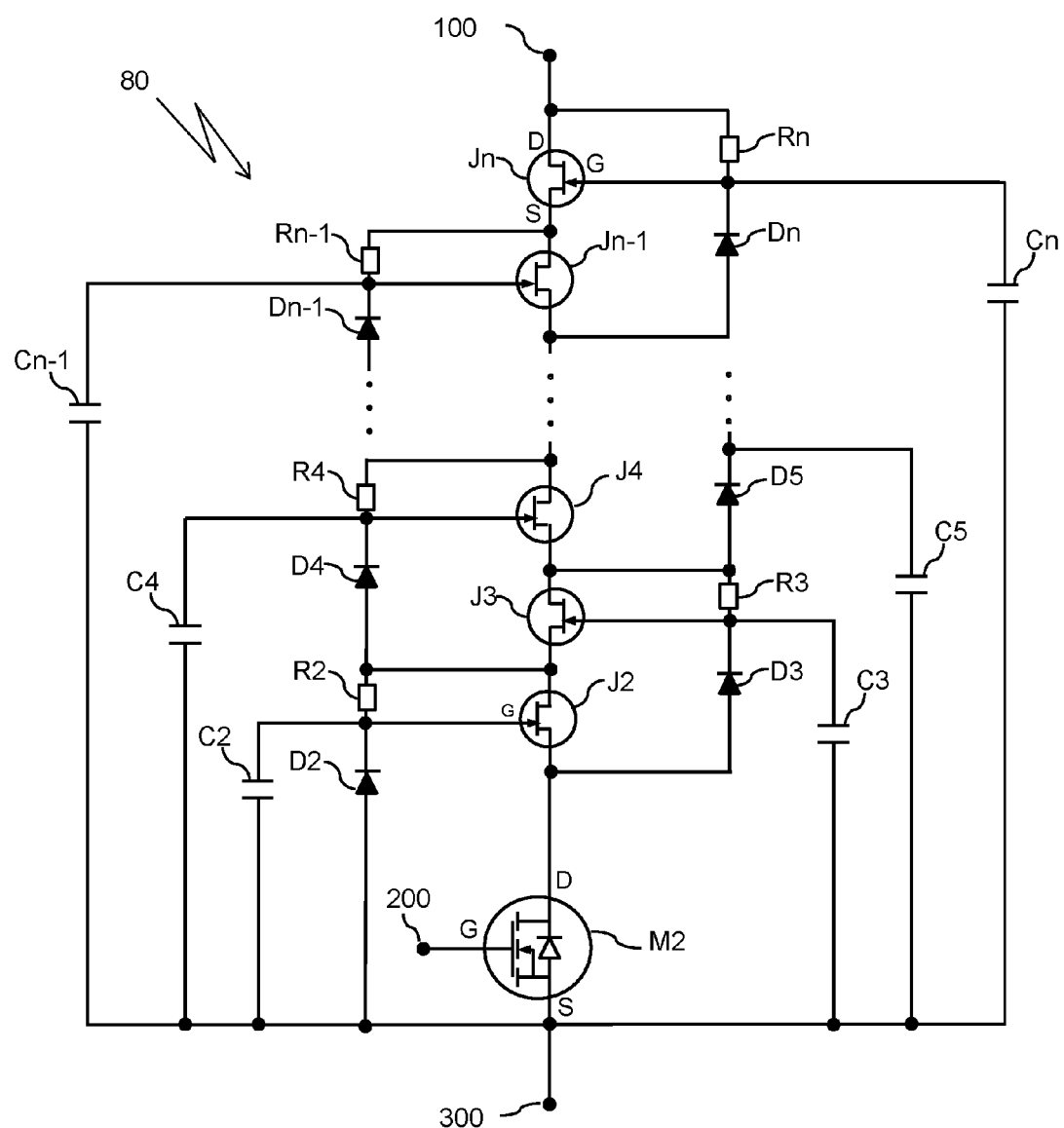
FIG. 8 shows the example circuit of FIG. 7 with added both load circuits and dynamic balancing circuits.

FIG. 8 shows a high-voltage switching device 80 which is based on the switch 70 of FIG. 7. The difference is that the switch 80 of FIG. 8 includes additional load circuits R2-Rn, each of which is connected between the drain and gate terminals of one of the JFETs J2-Jn, and additional balancing circuits C2-Cn, each of which is connected between the gate terminal of one of the JFETs J2-Jn and the source terminal of the high-voltage normally-off MOSFET M2.

Figure 9:
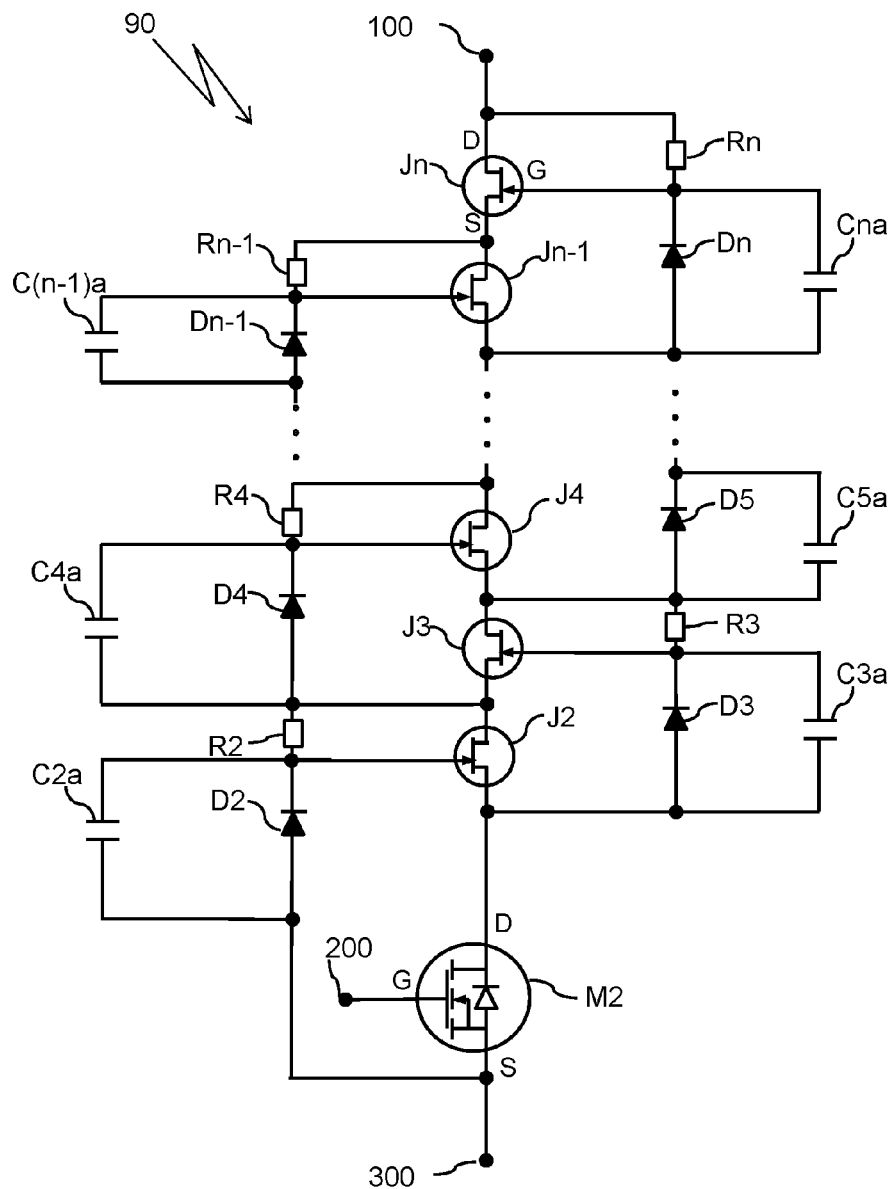
FIG. 9 shows the example circuit of FIG. 7 with added both load circuits and dynamic balancing circuits in an alternative configuration.

FIG. 9 shows a high-voltage switching device 90 which is also based on the switch 70 of FIG. 7. Like the switch 80 of FIG. 8, the switch 90 includes load circuits R2-Rn, each of which is connected between the drain and gate terminals of one of the JFETs J2-Jn. Switch 90 also includes dynamic balancing circuits C2a-Cna, but here each is connected in parallel with one of the voltage clamping devices D2-Dn.

Figure 10:
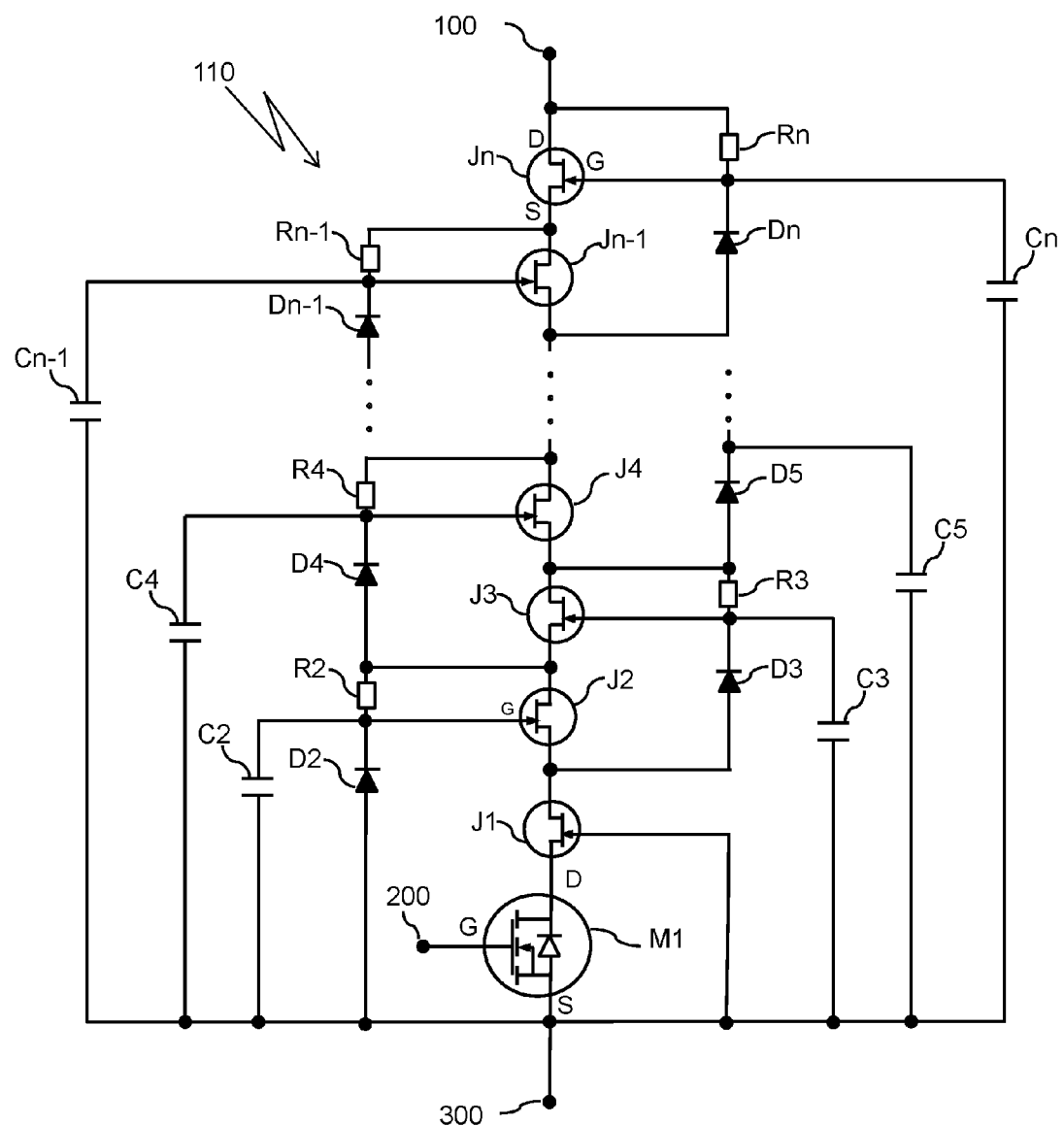
FIG. 10 shows the example circuit of FIG. 6 with added load circuits and dynamic balancing circuits.

It will be appreciated that the loading options illustrated in FIGS. 2, 3, 4, 5, 8, and 9 may be applied equally to circuits of the kind illustrated in FIG. 6. FIG. 10 shows a high-voltage switching device 110 which is based on the switch 60 of FIG. 6. The difference is that the switch 110 of FIG. 10 includes additional load circuits R2-Rn, each of which is connected between the drain and gate terminals of one of the JFETs J2-Jn, and additional balancing circuits C2-Cn, each of which is connected between the gate terminal of one of the JFETs J2-Jn and the source terminal of the normally-off MOSFET M1.

Figure 11:
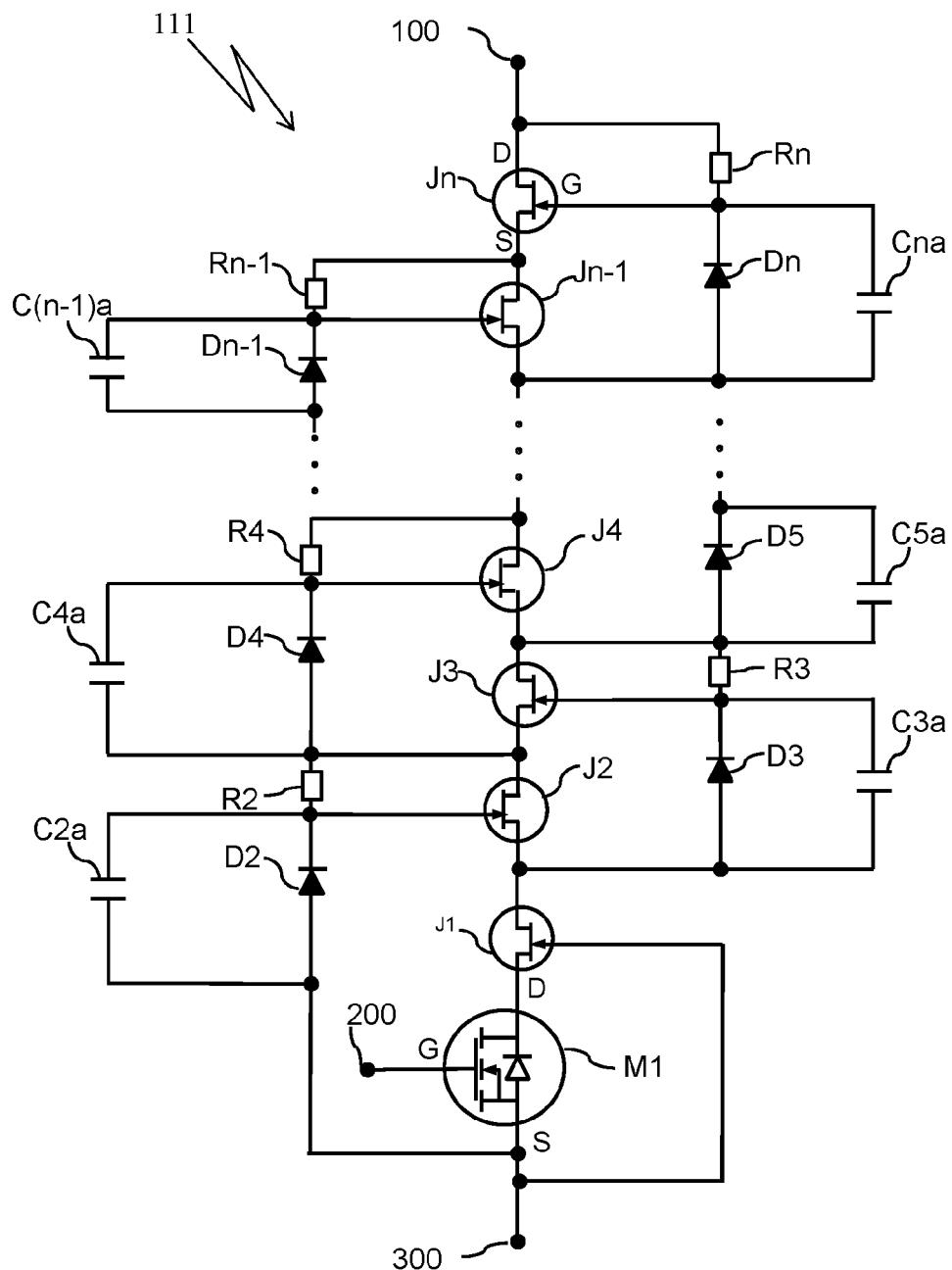
FIG. 11 shows the example circuit of FIG. 6 with added load circuits and dynamic balancing circuits in an alternative configuration.

FIG. 11 shows a high-voltage switching device 111 which is also based on the switch 60 of FIG. 6. Like the switch 110 of FIG. 10, the switch 111 includes load circuits R2-Rn, each of which is connected between the drain and gate terminals of one of the JFETs J2-Jn. Switch 111 also includes dynamic balancing circuits C2a-Cna, but here each is connected in parallel with one of the voltage clamping devices D2-Dn.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

I claim:

1. A high-voltage switch comprising:
a switching device, the switching device being a normally-off semiconductor device having a gate terminal, a drain terminal, and a source terminal;

a chain of transistors, the transistors being normally-on semiconductor devices each having a gate terminal, a drain terminal, and a source terminal, where transistors are connected in series drain-to-source, and where the source of the first transistor in the chain is connected to the drain of the switching device;

for each transistor in the chain from the second transistor in the chain to the penultimate transistor in the chain, a clamping device associated with the transistor, where an anode of the clamping device is connected to the source of the transistor, and a cathode of the clamping device is connected to the gate of the next transistor in the chain;

an additional clamping device associated with the second transistor in the chain, where an anode of the additional clamping device is connected to the source of the switching device, and a cathode of the additional clamping device is connected to the gate of the second transistor; and for each transistor in the chain from the second transistor in the chain to the last transistor in the chain, a load circuit comprising a resistor, the load circuit being connected between the drain of the transistor and the gate of the transistor, where the gate of the first transistor in the chain is connected to the source of the switching device.

2. The high-voltage switch of claim 1, where:

the switching device is a normally-off n-channel MOSFET; and the transistors are normally-on n-channel JFETs.

3. The high-voltage switch of claim 1, where:

each load circuit further comprises a transistor.

4. The high-voltage switch of claim 1, further comprising:

for each transistor in the chain from the second transistor in the chain to the last transistor in the chain, a dynamic balancing circuit comprising a capacitor, the dynamic balancing circuit being connected between the gate of the transistor and the source of the switching device.

5. The high-voltage switch of claim 1, further comprising:

for each transistor from the first transistor in the chain to the penultimate transistor in the chain, a dynamic balancing circuit comprising a capacitor, the dynamic balancing circuit being connected between the source of the transistor and the gate of the next transistor in the chain.

* * * * *